(12) United States Patent
Wu

(10) Patent No.: US 7,196,388 B2
(45) Date of Patent: Mar. 27, 2007

(54) MICROLENS DESIGNS FOR CMOS IMAGE SENSORS

(75) Inventor: Tien-Chi Wu, Yonghe (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 83 days.

(21) Appl. No.: 10/908,837

(22) Filed: May 27, 2005

(65) Prior Publication Data

US 2006/0267123 A1    Nov. 30, 2006

(51) Int. Cl.
*H01L 31/00* (2006.01)
(52) U.S. Cl. .................................... 257/431
(58) Field of Classification Search ............. 257/431
See application file for complete search history.

(56) References Cited

U.S. PATENT DOCUMENTS

| 5,595,930 | A |   | 1/1997  | Baek |
|-----------|---|---|---------|------|
| 5,677,200 | A | * | 10/1997 | Park et al. ............... 438/70 |
| 5,796,154 | A |   | 8/1998  | Sano et al. |
| 6,001,540 | A | * | 12/1999 | Huang et al. ............ 430/321 |
| 6,252,218 | B1 |  | 6/2001  | Chou |
| 6,274,917 | B1 |  | 8/2001  | Fan et al. |
| 6,495,813 | B1 |  | 12/2002 | Fan et al. |
| 6,643,386 | B1 |  | 11/2003 | Foster |
| 6,737,719 | B1 |  | 5/2004  | Yamamoto |

* cited by examiner

*Primary Examiner*—Roy Karl Potter
(74) *Attorney, Agent, or Firm*—Baker & McKenzie LLP

(57) ABSTRACT

Described are microlens designs to increase quantum efficiency and improve photonic performance of photosensitive integrated circuit device. A photosensitive integrated circuit made up of photodiodes, dielectric layers, metal contact holes, metal layers, and passivation stacks are formed on a semiconductor substrate. Microlenses are then formed over these encapsulating layers, the microlenses comprising nonplanar surfaces, in particular a biconvex microlens formed above the photodiodes to direct, deliver, and focus incident light to the photodiodes for increased quantum efficiency and improved photonic performance. Color filters are then formed over the microlenses and the photodiodes so as to filter specific wavelengths of light.

18 Claims, 10 Drawing Sheets

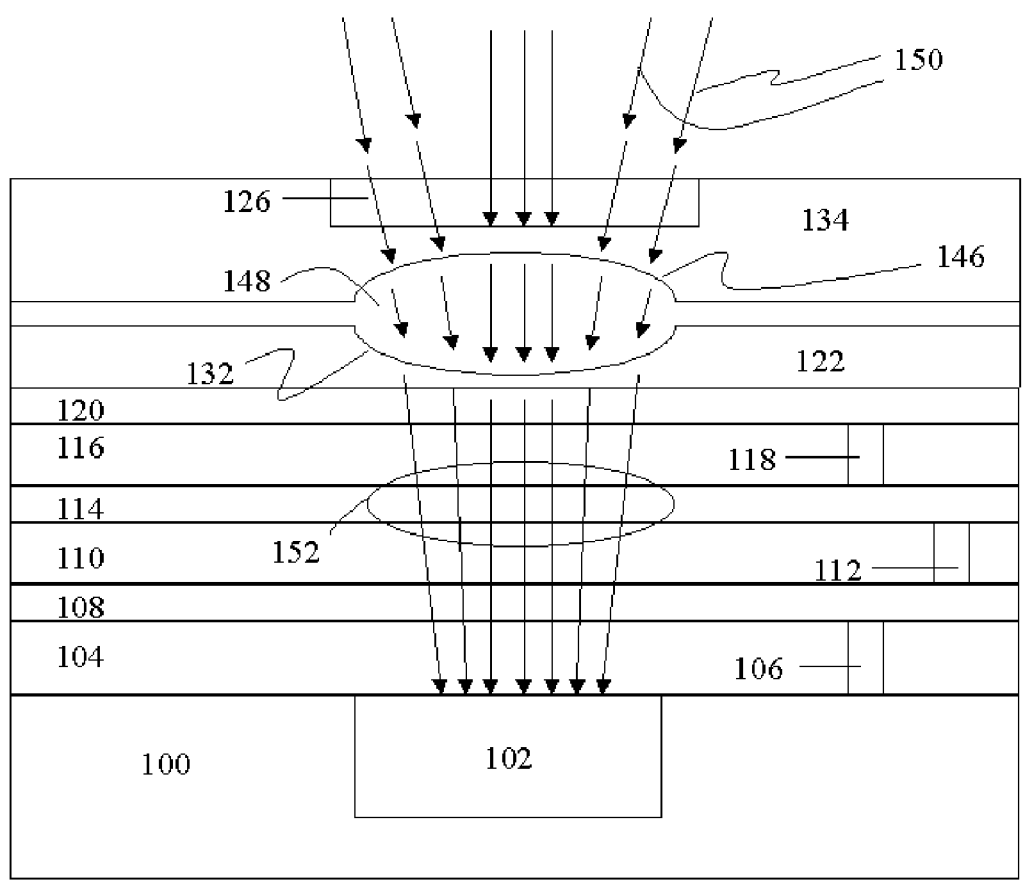

MICROLENS DESIGNS FOR CMOS IMAGE SENSORS

FIELD OF ACTIVITY

Described are microlens designs to increase quantum efficiency and improve photonic performance of photosensitive integrated circuits and methods of manufacturing thereof.

BACKGROUND OF THE INVENTION

Photosensitive integrated circuits such as image sensors and color filters play an important role in capturing images in optical electronic devices. These integrated circuits have been found in consumer electronics products and portable devices such as digital cameras, digital camcorders, and cellular phones. The basics of a complementary metal oxide semiconductor (CMOS) image sensor involves light being filtered by color filters, passing through passivation stacks, metal layers, metal contact holes, dielectric layers, and accepted through photodiodes. The photodiodes then transform the light energy into electrical signals.

Quantum efficiency is one of the factors in determining the photonic performance of photosensitive integrated circuits. The more light a photodiode can collect, the higher is its quantum efficiency, and therefore the better the device performance. One of the ways of boosting quantum efficiency is to add microlenses to collect light energy and to focus that light energy onto the underlying photodiodes.

SUMMARY OF THE INVENTION

Described are microlens designs that increase quantum efficiency and improve photonic performance of photosensitive integrated circuit devices. Photodiodes are formed on a semiconductor substrate by known fabrication techniques. Inter-level metals and dielectrics, metal contact holes, and passivation stacks are subsequently formed over the photodiodes. Microlenses are then formed over these encapsulating layers, and in particular the disclosed embodiments describe a biconvex microlens design. Color filters are then formed over the microlenses and the photodiodes so as to filter specific wavelengths of light.

BRIEF DESCRIPTION OF THE DRAWINGS

FIG. 4 is a cross-sectional view of an embodiment showing its performance in directing incident light.

DETAILED DESCRIPTION OF THE EMBODIMENTS

Figure 1:
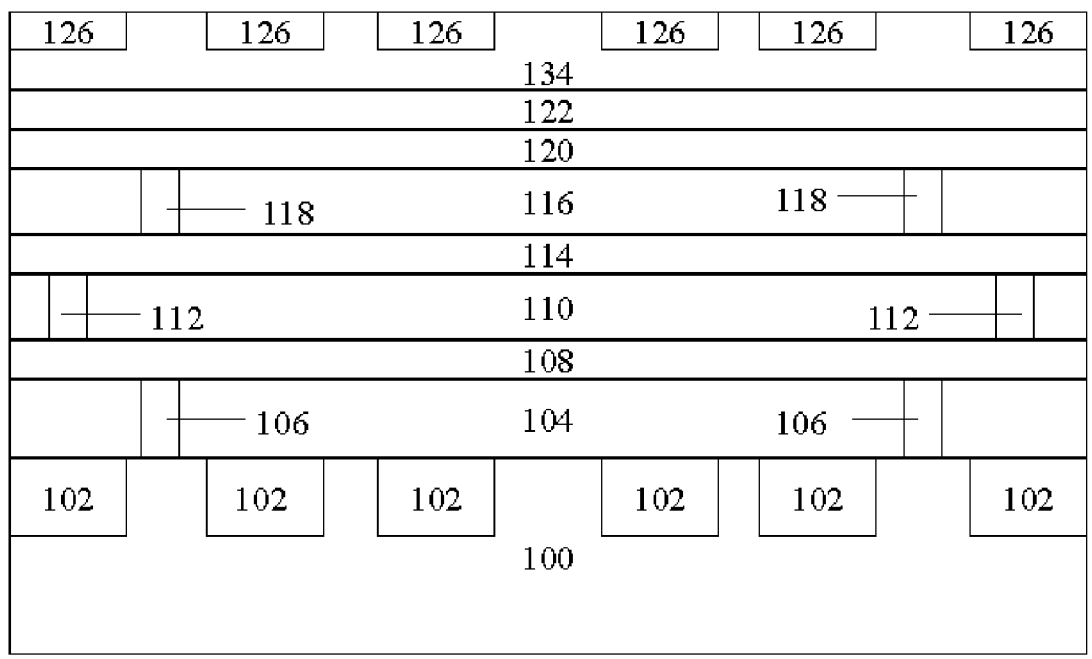
FIG. 1 is a cross-sectional view of a prior-art photosensitive integrated circuit device that does not use microlenses.

Initial reference is made to FIG. 1, which is a cross-sectional view of a prior-art photosensitive integrated circuit device that does not use microlenses. A plurality of photodiodes 102 of either n-type or p-type doped regions are initially formed on a monocrystalline silicon semiconductor substrate 100. The n-type or p-type dopants used may comprise phosphorous, boron, or other known impurities.

A layer of dielectric material 104 may then be formed over the photodiodes 102 and the semiconductor substrate 100 by known deposition techniques such as chemical vapor deposition, plasma deposition, or spin-on techniques and using materials such as silicon oxide, silicon nitride, silicon oxynitride, or doped/undoped silicate glass. This layer of dielectric material 104 serves to insulate the underlying photodiodes 102 and the semiconductor substrate 100 from later-formed conductive layers. A plurality of openings or contact holes 106 may be formed in the dielectric layer 104. These openings 106 are subsequently filled with a metallic material such as aluminum, gold, copper, or tungsten thereby forming metal contact holes 106.

The metal contact holes 106 facilitate the transmission of electrical signals within the photosensitive integrated circuit. To facilitate further semiconductor processing, the layer of dielectric material 104 and the metal contact holes 106 are chemically and mechanically polished to planarize or smooth their topography, and a metal layer 108 is subsequently formed. The metal layer 108, like the metal contact holes 106, is also formed of a metallic material such as aluminum, gold, copper, or tungsten, and also serves to facilitate the transmission of electrical signals.

As shown in FIG. 1, additional layers of dielectric material, metal contact holes, and metal layers may subsequently be added according to design needs and performance requirements of the photosensitive device. Thus, a second and third layer of dielectric material 110, 116 may be formed using the same or similar processing steps as the ones described for forming the first layer of dielectric material 104. Likewise, a second and third set of metal contact holes 112, 118 may be formed using the same or similar processing steps as the ones described for forming the first metal contact holes 106, and a second and third metal layer 114, 120 may be formed using metallization processes similar to the one used for forming the first metal layer 108.

Some photosensitive devices can respond to a broad range of wavelengths of light that cover the entire visible light spectrum, whereas in some cases it is desirable to narrow the ranges of wavelengths of light for specific applications that require a selected region of color or frequency. To make the photodiodes 102 respond to a particular wavelength of light, the third metal layer 120 is planarized employing chemical and mechanical polishing in order to facilitate the formation of color filters 126. Once planarized, meaning that the topography has been smoothed, a passivation stack 122 may then be formed over the third metal layer 120 employing known deposition techniques and using materials such as silicon oxide, silicon nitride, silicon oxynitride, spin-on glass, or doped/undoped silicate glass. The passivation stack 122 serves to insulate and protect all the layers underneath it from potential environmental or physical impairment. A spacer layer 134 may subsequently be formed over the passivation stack 122 using similar material and method. A plurality of color filters 126 may then be formed over the spacer layer 134 above and about the photodiodes 102. The plurality of color filters 126 may also be arranged in unique patterns to form color filter arrays in order to achieve the desired sensitivity and performance characteristics. Each color filter 126 may be constructed such that a single color is assigned to each photodiode 102 and that each photodiode 102 responds to only one wavelength of light or one color.

Figure 2A:
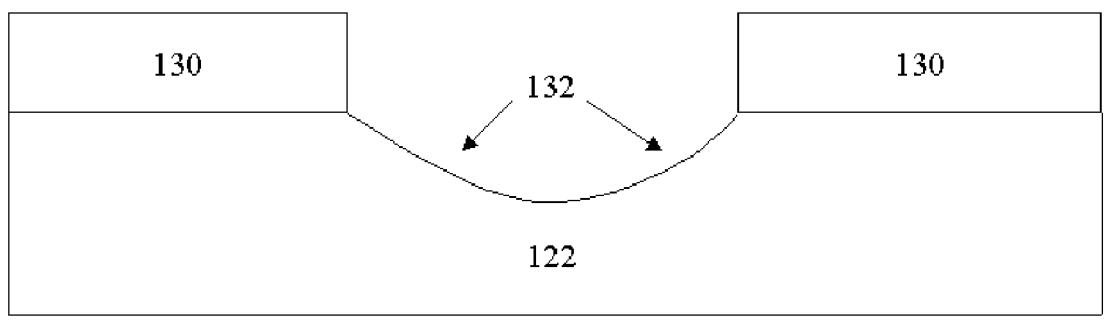
FIGS. 2A–2G are cross-sectional diagrams illustrating progressive stages of forming biconvex microlenses.

Microlenses that can increase quantum efficiency and improve photonic performance may be formed between the passivation stack 122 and the spacer layer 134 as illustrated in FIGS. 2A–2G. As illustrated in FIG. 2A, a photoresist pattern 130 may be formed over a passivation stack 122 by known processing materials and techniques. Subsequently, the passivation stack 122 may be etched with either a chemical dry or wet etch process. Etching will selectively remove materials thereby leaving a desired profile. A chemical wet etch is employed in the present embodiment to produce a downwardly convex profile 132 or in other words a U-shaped profile. The photoresist pattern 130 may be removed by known methods afterwards.

Figure 2B:
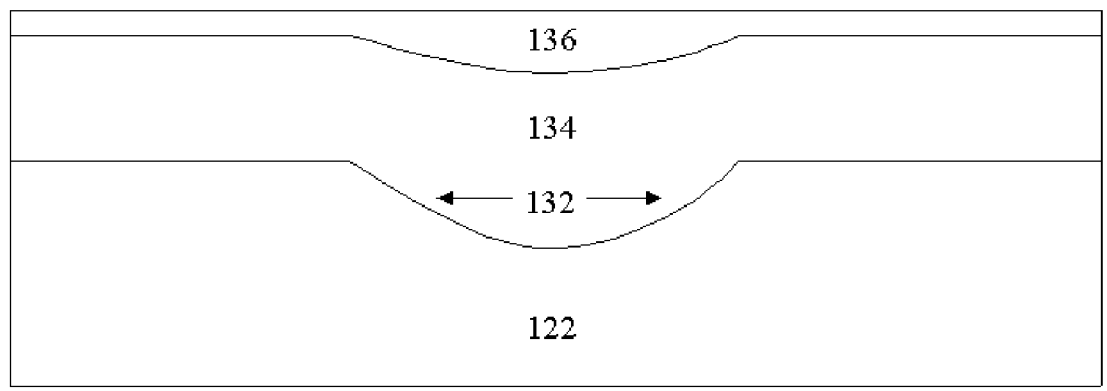

A layer of dielectric material 134 may subsequently be formed over the downwardly convex profile 132 as illustrated in FIG. 2B. The dielectric layer 134 may be formed of materials such as silicon oxide, silicon nitride, silicon oxynitride, or doped/undoped silicate glass with known deposition techniques as discussed earlier. Additionally, photoresist and benzocyclobutene (BCB) may also be used. After depositing the dielectric material 134, a layer of spin-on glass (SOG) 136 may subsequently be formed over the dielectric layer 134 in order to planarize or level the wafer for further processing. Instead of using SOG 136, other planarizing or dielectric materials may also be used.

Figure 2C:
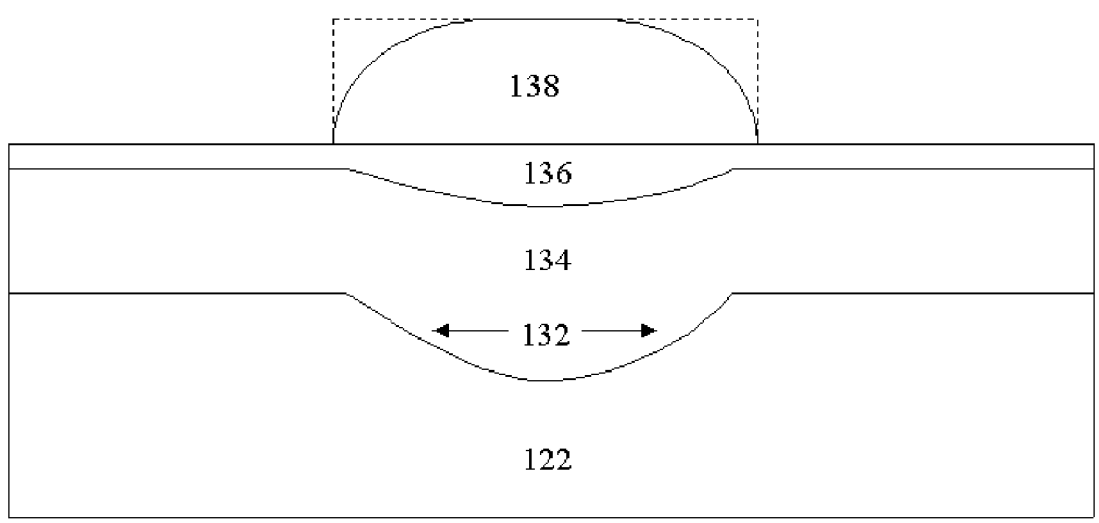

The wafer is then subjected to similar lithographic processes as discussed earlier and another photoresist pattern 138 may be formed as shown in FIG. 2C. This photoresist pattern 138, however, has been subjected to a reflow cycle performed at high temperatures. As a result of the thermal heat, the chemical bonds within the photoresist degrades and the profile 138 loses its sharp rectangular corners. Consequently, the new photoresist pattern 138 has rounded corners as shown.

Figure 2D:
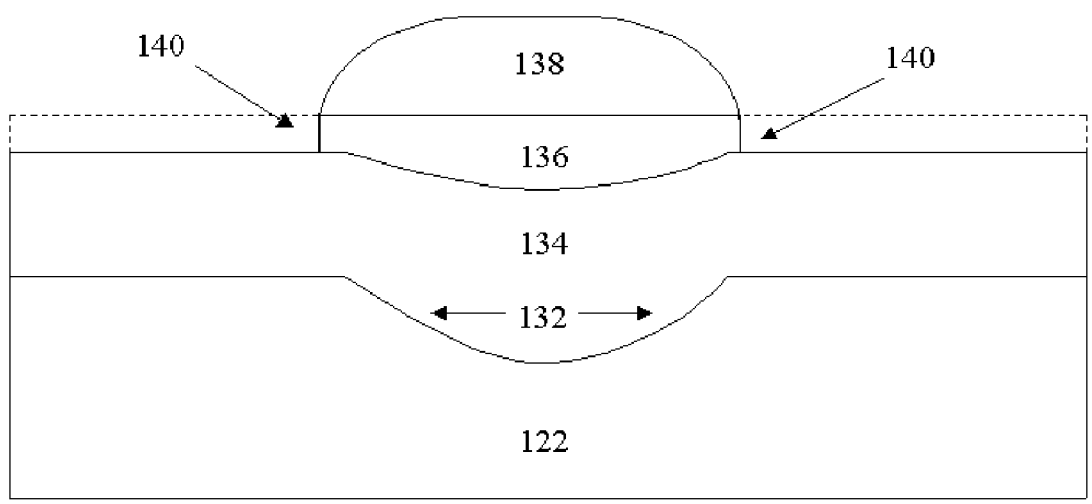

Using the rounded photoresist profile 138 as an etch mask, the SOG 136 may then be etched. Depending on the composition of the material used, the etching process may be a chemical dry or wet etch. As a result of the chemical etching, some material will be removed from the SOG 136 resulting in a slightly etched profile 140 as illustrated in FIG. 2D. The slightly etched profile 140 of the SOG 136 may be accomplished by controlling the timing of the wet or dry chemical etch process using known fabrication techniques. Consequently, the dielectric layer 134 may also be etched.

Figure 2E:
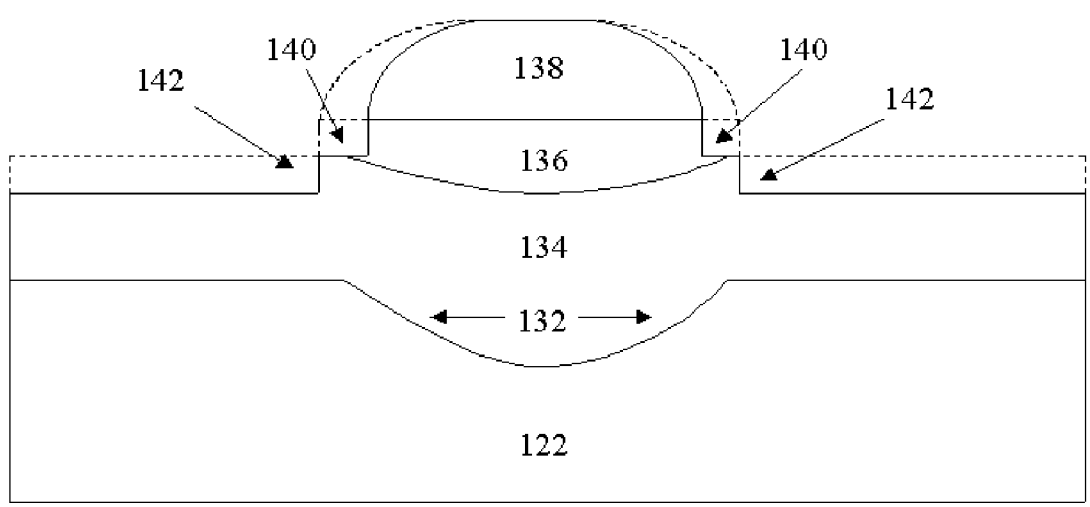
Figure 2F:
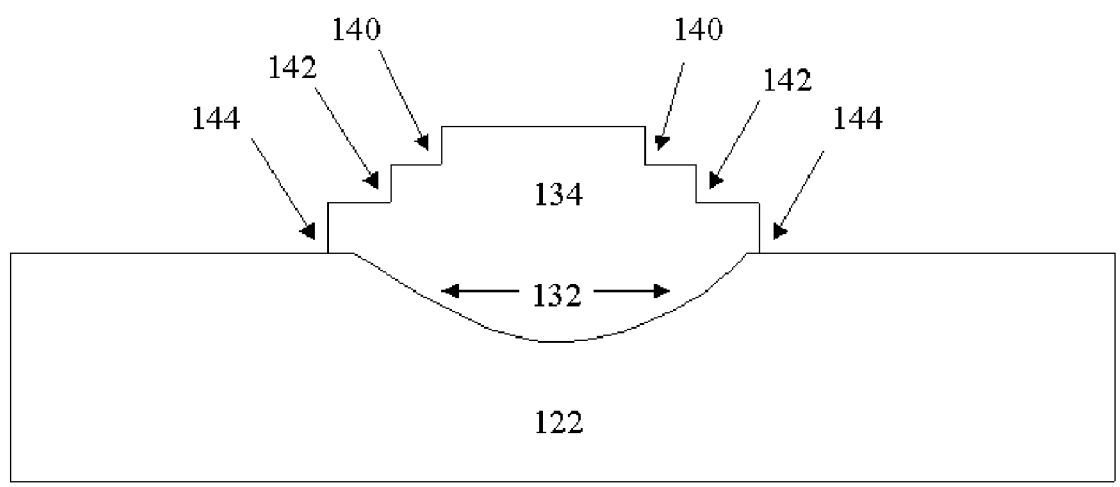

Taking the device as illustrated in FIG. 2D, the rounded photoresist profile 138 may be reduced and the etching process may continue as illustrated in FIG. 2E. As shown, the rounded photoresist profile 138 has been reduced through chemical etching or removal of the photoresist 138. By selectively controlling the etch process, the rounded photoresist profile 138 creates another etch mask whereby another slightly etched profile 142 may be produced. Repeating the previously described etch processes once more will thereby produce a stair-like profile 140, 142, 144 within the dielectric layer 134 as illustrated in FIG. 2F. The etch process may be controlled to stop at any given layer, whether the SOG 136 or the dielectric layer 134. In other words, there may not be any SOG 136 remaining after three consecutive etches. Additionally, although the stair-like profile 140, 142, 144 as illustrated in the present embodiment only shows three steps of stairs because the etch process was repeated three times, the etch processing steps may be employed to generate as many or as few steps of stairs as necessary. In other words, the stair-like profile 140, 142, 144 may have as few as one or two steps or as many as four to ten steps.

Figure 2G:
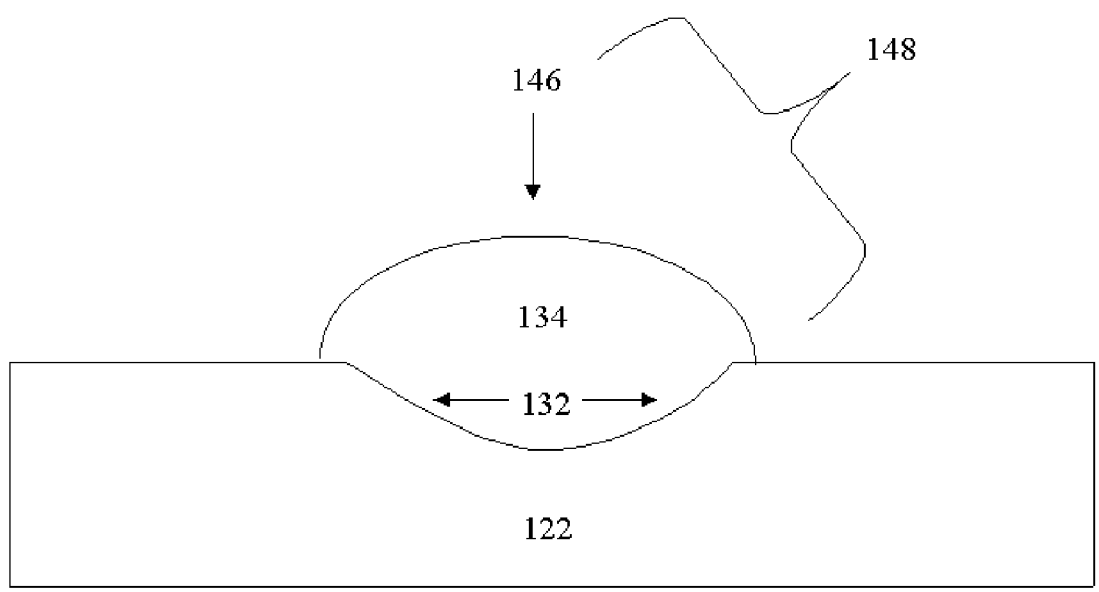

The resulting stair-like profile 140, 142, 144 of FIG. 2F may then be subjected to a chemical dry or wet etch process to round out or smooth the sharp rectangular corners as illustrated in FIG. 2G. The result of the rounding process is a rounded profile 146 with an upwardly convex shape. An upwardly convex shape is one where there is a greater area at the bottom than at the top, or in other words, the feature is shaped like an upside down U. The resulting upwardly convex profile 146, together with the downwardly convex profile 132, form one embodiment of the microlens structure 148. In addition, the biconvex microlens 148, as described in the present embodiment, made up of a combination of a downwardly convex profile 132 as the bottom surface and an upwardly convex profile 136 as the top surface, may also be etch transferred into any underlying layers. In other words, the biconvex microlens 148 need not be formed over the passivation stack 122, it may be formed anywhere within any of the encapsulating layers previously described.

Furthermore, the two curvatures of the biconvex microlens 148 in the present embodiment need not have the same or similar radius of curvatures. In other words, the curvature of the downwardly convex profile 132 and the curvature of the upwardly convex profile 146 need not be the same or have the same radius but may be individually tailored or customized based on lithographic and etch processes.

Figure 3:
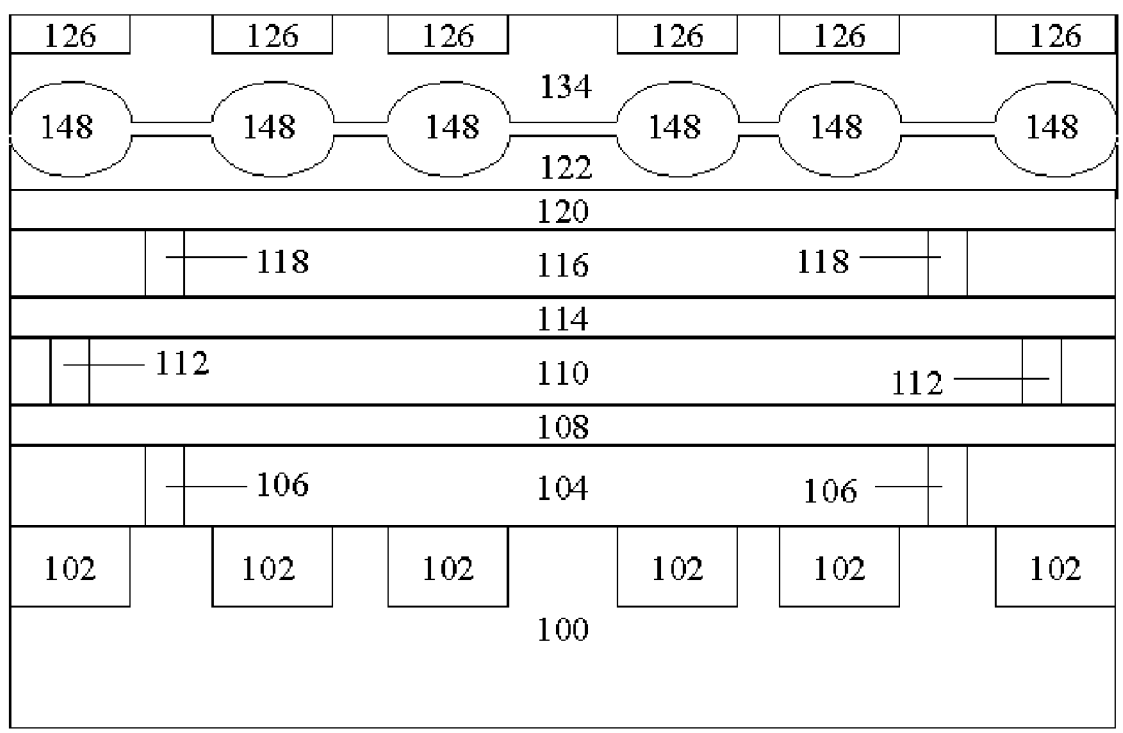
FIG. 3 is a cross-sectional view of a photosensitive integrated circuit device as might be formed by the processes of FIGS. 2A–2G.

The cross-sectional view of a photosensitive integrated circuit using the present embodiment of a biconvex microlens 148 is illustrated in FIG. 3. As illustrated, the microlens 148 may be made up of a biconvex lens formed between the passivation stack 122 and the spacer layer 134, and may be employed within a photosensitive integrated circuit device that does not use microlenses.

FIG. 4 illustrates the performance of the present embodiment of a biconvex microlens 148 at directing and concentrating incident light. As illustrated, when incident light 150 enters the photosensitive integrated circuit device, it may be refracted by the biconvex microlens 148 and the resulting refracted photons will be directed 152 into the photodiodes 102. Perpendicular or on-axis incident light 150 will enter the biconvex microlens 148 directly undisturbed and into the photodiodes 102. On-axis incident light 150 is defined as light photons that enter the photosensitive integrated circuit perpendicularly or at right angles (90 degrees) with respect to the plurality of photodiodes 102. The photodiodes 102 then readily collect and transform the light photons into electrical signals. The more light energy the photodiodes 102 can collect, the higher the quantum efficiency and therefore the higher the optical performance of the device.

As non-perpendicular or off-axis incident light 150 enters the biconvex microlens 148, it initially refracts off the upwardly convex profile 146 of the biconvex microlens 148. It subsequently refracts again (twice refracted) off the downwardly convex profile 132 of the biconvex microlens 148. Consequently, the redirected light 152 is then transmitted to and collected by the photodiodes 102. Off-axis incident light 150 is defined as all light photons or signals that enter the photosensitive integrated circuit at oblique angles (angles that are not 90 degrees) with respect to the plurality of photodiodes 102.

The reason that off-axis incident light 150 will refract off the biconvex microlens 148 is because of the difference in the index of refraction. The index of refraction is a measure of the amount of diffraction or photon bending that takes place when light passes through a certain material. When incident light 150 moves from one medium into another, in our case from air into the biconvex microlens 148, its path and angle of travel will be altered because of the difference in the index of refraction between air and the microlens material 148. Furthermore, the magnitude of the refraction may be tuned based on the material composition of the microlens material 148.

Thus, non-perpendicular off-axis incident light 150 that enter the biconvex microlens 148 will refract off both curvatures, first refraction through the upwardly convex profile 146 and then secondly through the downwardly convex profile 132, and the redirected light 152 may then be transmitted to and collected by the photodiodes 102 for added photon efficiency. Additional understanding of the benefits of a biconvex microlens 148 may be found in an article by Piero Mazzinghi et al., *Overview of possible optical adaptors for EUSO,* 5164 PROCEEDINGS OF SPIE: UV/EUV AND VISIBLE SPACE INSTRUMENTATION FOR ASTRONOMY II 100–12 (2003), available at http://spiedl.aip.org/dbt/dbt.jsp?KEY=PSISDG&Volume=5164&Issue=1&bproc=year&scode=2003, or in an article by Vojko Bratina and Piero Mazzinghi, *Optical adapters for EUSO focal surface—lens system,* available at http://hep.fi.infn.it/AIR-WATCH/pubblicazioni/conclenses.pdf (Oct. 9, 2002). Consequently, a photosensitive integrated circuit device using the disclosed embodiment of a biconvex microlens 148 will have increased photon efficiency and improved photonic performance.

It will be appreciated by those of ordinary skill in the art that the invention can be embodied in other specific forms without departing from the spirit or essential character thereof. The presently disclosed embodiments are therefore considered in all respects to be illustrative and not restrictive. For example, the biconvex microlens 148 need not be formed of a single material. It may be formed of a mixture of different layers and chemical compositions, such as the upwardly convex profile 146 being formed of silicon nitride and the downwardly convex profile 132 being formed of a photoresist. The scope of the invention is indicated by the appended claims rather than the foregoing description, and all changes that come within the meaning and ranges of equivalents thereof are intended to be embraced therein.

Additionally, the section headings herein are provided for consistency with the suggestions under 37 C.F.R. § 1.77 or otherwise to provide organizational cues. These headings shall not limit or characterize the invention(s) set out in any claims that may issue from this disclosure. Specifically and by way of example, although the headings refer to a "Technical Field," the claims should not be limited by the language chosen under this heading to describe the so-called technical field. Further, a description of a technology in the "Background" is not to be construed as an admission that technology is prior art to any invention(s) in this disclosure. Neither is the "Summary of the Invention" to be considered as a characterization of the invention(s) set forth in the claims found herein. Furthermore, any reference in this disclosure to "invention" in the singular should not be used to argue that there is only a single point of novelty claimed in this disclosure. Multiple inventions may be set forth according to the limitations of the multiple claims associated with this disclosure, and the claims accordingly define the invention(s), and their equivalents, that are protected thereby. In all instances, the scope of the claims shall be considered on their own merits in light of the specification, but should not be constrained by the headings set forth herein.

What is claimed is:

1. A photosensitive integrated circuit device, comprising:
    a semiconductor substrate;
    a plurality of photodiodes formed on the semiconductor substrate;
    a plurality of microlenses formed over the photodiodes, the microlenses comprising two non-planar surfaces with different curvatures formed above and about the photodiodes; and
    a plurality of color filters formed above and about the microlenses.

2. A device according to claim 1, wherein the top non-planar surface is upwardly convex.

3. A device according to claim 1, wherein the bottom non-planar surface is downwardly convex.

4. A device according to claim 1, wherein the two non-planar surfaces are reflective layers operable to direct incident light to the photodiodes.

5. A device according to claim 4, wherein the incident light enters the microlens at right angles and at oblique angles.

6. A device according to claim 1, wherein the two non-planar surfaces are formed substantially of a photoresist material.

7. A device according to claim 6, wherein the photoresist material is selected from the group consisting of positive photoresist, negative photoresist, and benzocyclobutene (BCB).

8. A device according to claim 1, wherein the two non-planar surfaces are formed substantially of a dielectric material.

9. A device according to claim 8, wherein the dielectric material is selected from the group consisting of silicon nitride, silicon oxide, silicon oxynitride, spin-on glass, doped silicate glass, and undoped silicate glass.

10. A device according to claim 1, wherein the top non-planar surface has similar or different material composition as the bottom non-planar surface of the microlens.

11. A device according to claim 1, wherein the top non-planar surface is upwardly convex and the bottom non-planar surface is upwardly convex.

12. A photosensitive integrated circuit device, comprising:
    a semiconductor substrate;
    a plurality of photodiodes formed on the semiconductor substrate;
    a plurality of microlenses formed over the photodiodes, the microlenses comprising two downwardly convex surfaces with different curvatures formed above and about the photodiodes; and
    a plurality of color filters formed above and about the microlenses.

13. A device according to claim 12, wherein the top downwardly convex surface has similar or different material composition as the bottom downwardly convex surface of the microlens.

14. A device according to claim 12, wherein the top downwardly convex surface is formed substantially of a photoresist material and the bottom downwardly convex surface is formed substantially of a dielectric material.

15. A device according to claim 12, wherein the top downwardly convex surface is formed substantially of a dielectric material and the bottom downwardly convex surface is formed substantially of a photoresist material.

16. A photosensitive integrated circuit device, comprising:
    a semiconductor substrate;
    a plurality of photodiodes formed on the semiconductor substrate;
    a plurality of microlenses formed over the photodiodes, the bottom of the microlens comprising a downwardly convex surface and the top of the microlens comprising an upwardly convex surface formed above and about the photodiodes, the microlens further comprising a planar layer embedded in between the bottom downwardly convex surface and the top upwardly convex surface; and a plurality of color filters formed above and about the microlenses.

17. A device according to claim 16, wherein the top upwardly convex surface has similar or different material composition as the bottom downwardly convex surface of the microlens.

18. A device according to claim 16, wherein the embedded planar layer has similar or different material composition as the two surfaces of the microlens.

* * * * *